US012623716B2

(12) United States Patent
Williams et al.

(10) Patent No.: US 12,623,716 B2
(45) Date of Patent: May 12, 2026

(54) INTERMITTENCY DETECTOR FOR RESISTANCE TO POWERPACK

(71) Applicant: Steering Solutions IP Holding Corporation, Saginaw, MI (US)

(72) Inventors: David M. Williams, Millington, MI (US); Ashish Verma, Cedar Rapids, IA (US); Julie A. Kleinau, Bay City, MI (US); Peter D. Schmitt, Farmington Hills, MI (US); Christopher J. Sommer, Swartz Creek, MI (US); Kevin L. Derry, Wheeler, MI (US); Mary K. Williams, Millington, MI (US)

(73) Assignee: Steering Solutions IP Holding Corporation, Saginaw, MI (US)

( * ) Notice: Subject to any disclaimer, the term of this patent is extended or adjusted under 35 U.S.C. 154(b) by 126 days.

(21) Appl. No.: 18/422,588

(22) Filed: Jan. 25, 2024

(65) Prior Publication Data
US 2025/0115289 A1     Apr. 10, 2025

Related U.S. Application Data

(60) Provisional application No. 63/542,437, filed on Oct. 4, 2023.

(51) Int. Cl.
*B62D 5/00*          (2006.01)
*B62D 5/04*          (2006.01)
*G01R 31/00*        (2006.01)

(52) U.S. Cl.
CPC ......... *B62D 5/0463* (2013.01); *B62D 5/0481* (2013.01); *G01R 31/007* (2013.01)

(58) Field of Classification Search
CPC ...... B62D 5/0463; B62D 5/0481; B62D 5/00; G01R 31/007
USPC ....................................................... 701/29.2
See application file for complete search history.

(56) References Cited

U.S. PATENT DOCUMENTS 9,242,576 B1 *    1/2016  Turnbull ................. H02P 29/68

* cited by examiner

*Primary Examiner* — Shardul D Patel
(74) *Attorney, Agent, or Firm* — Dickinson Wright PLLC

(57)                    ABSTRACT

A method for detecting degradation intermittencies in an electrical connection in a steering system of a vehicle includes, using a processor configured to execute instructions, receiving an input indicative of a plurality of measurements of resistance associated with the electrical connection, calculating, based on the received input, at least one adaptive control threshold, comparing a first measurement of the plurality of measurements to the at least one adaptive control threshold, determining whether the electrical connection has a degradation intermittency in response to the comparison between the first measurement and the at least one adaptive control threshold, and performing at least one action in response to determining that the electrical connection has the degradation intermittency.

19 Claims, 12 Drawing Sheets

P(L) = Limiting Performance Factor t(L) = Lifetime

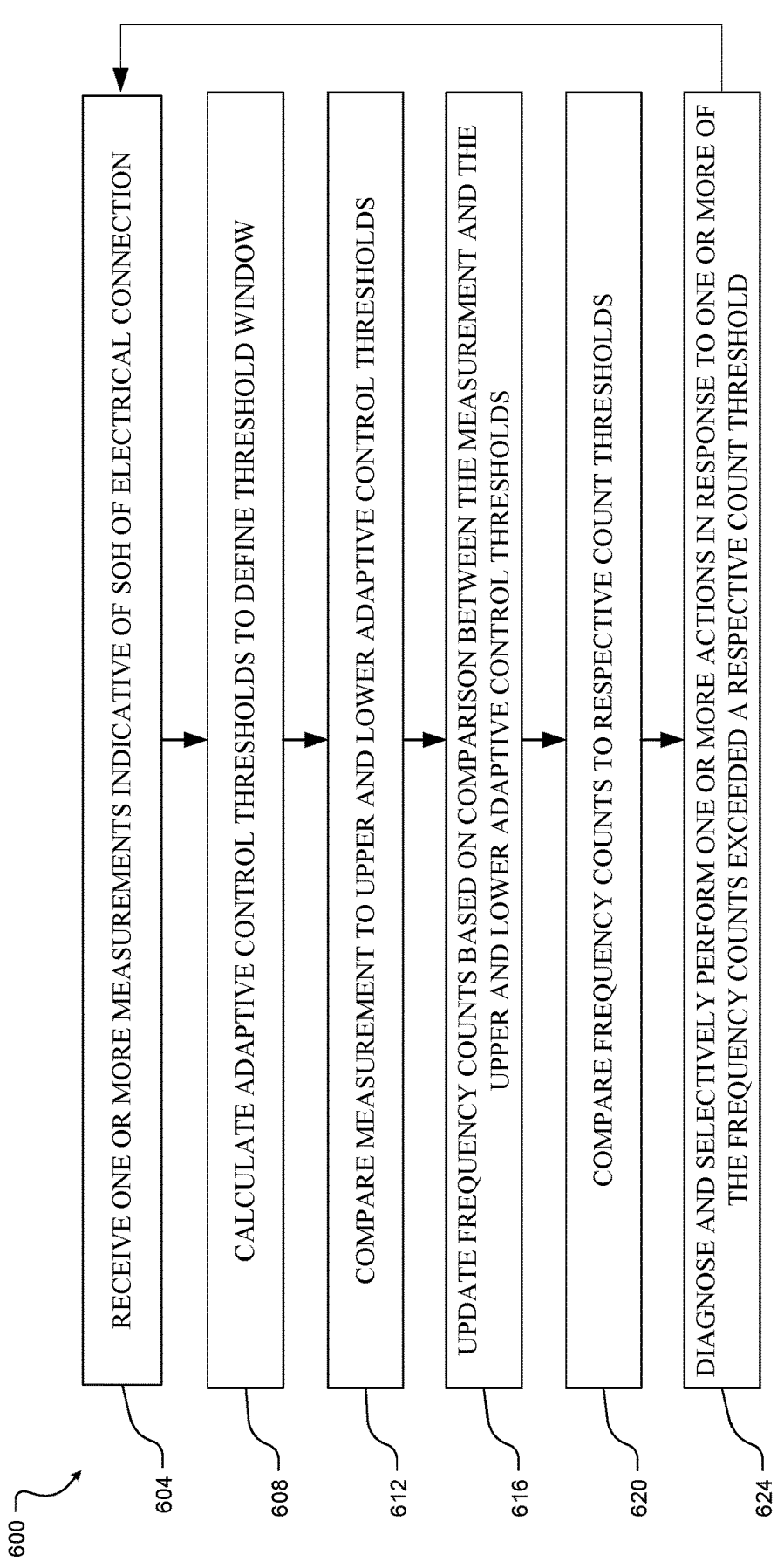

RECEIVE ONE OR MORE MEASUREMENTS INDICATIVE OF SOH OF ELECTRICAL CONNECTION

CALCULATE ADAPTIVE CONTROL THRESHOLDS TO DEFINE THRESHOLD WINDOW

COMPARE MEASUREMENT TO UPPER AND LOWER ADAPTIVE CONTROL THRESHOLDS

UPDATE FREQUENCY COUNTS BASED ON COMPARISON BETWEEN THE MEASUREMENT AND THE UPPER AND LOWER ADAPTIVE CONTROL THRESHOLDS

COMPARE FREQUENCY COUNTS TO RESPECTIVE COUNT THRESHOLDS

DIAGNOSE AND SELECTIVELY PERFORM ONE OR MORE ACTIONS IN RESPONSE TO ONE OR MORE OF THE FREQUENCY COUNTS EXCEEDED A RESPECTIVE COUNT THRESHOLD

INTERMITTENCY DETECTOR FOR RESISTANCE TO POWERPACK

CROSS-REFERENCE TO RELATED APPLICATIONS

This application claims the benefit of U.S. Provisional Application No. 63/542,437, filed on Oct. 4, 2023. The entire disclosure of the application referenced above is incorporated herein by reference.

TECHNICAL FIELD

This disclosure relates to systems and methods for monitoring state of health of connections between a power source and an electric power steering (EPS) system.

BACKGROUND OF THE INVENTION

A vehicle, such as a car, truck, sport utility vehicle, crossover, mini-van, marine craft, aircraft, all-terrain vehicle, recreational vehicle, or other suitable forms of transportation, typically includes a steering system, such as an electronic power steering (EPS) system, a steer-by-wire (SbW) steering system, a hydraulic steering system, or other suitable steering system. The steering system of such a vehicle typically controls various aspects of vehicle steering including providing steering assist to an operator of the vehicle, controlling steerable wheels of the vehicle, and the like.

SUMMARY OF THE INVENTION

This disclosure relates generally to determining state of health of an electrical connection in a steering system of a vehicle.

In an example, a method for detecting degradation intermittencies in an electrical connection in a steering system of a vehicle includes, using a processor configured to execute instructions, receiving an input indicative of a plurality of measurements of resistance associated with the electrical connection, calculating, based on the received input, at least one adaptive control threshold, comparing a first measurement of the plurality of measurements to the at least one adaptive control threshold, determining whether the electrical connection has a degradation intermittency in response to the comparison between the first measurement and the at least one adaptive control threshold, and performing at least one action in response to determining that the electrical connection has the degradation intermittency.

Other aspects of the disclosed embodiments include systems configured to perform steps and functions of the described methods.

These and other aspects of the present disclosure are disclosed in the following detailed description of the embodiments, the appended claims, and the accompanying figures.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

FIG. 6 is a flow diagram generally illustrating steps of an example method for detecting degradation intermittencies according to the principles of the present disclosure.

DETAILED DESCRIPTION

Figure 1A:
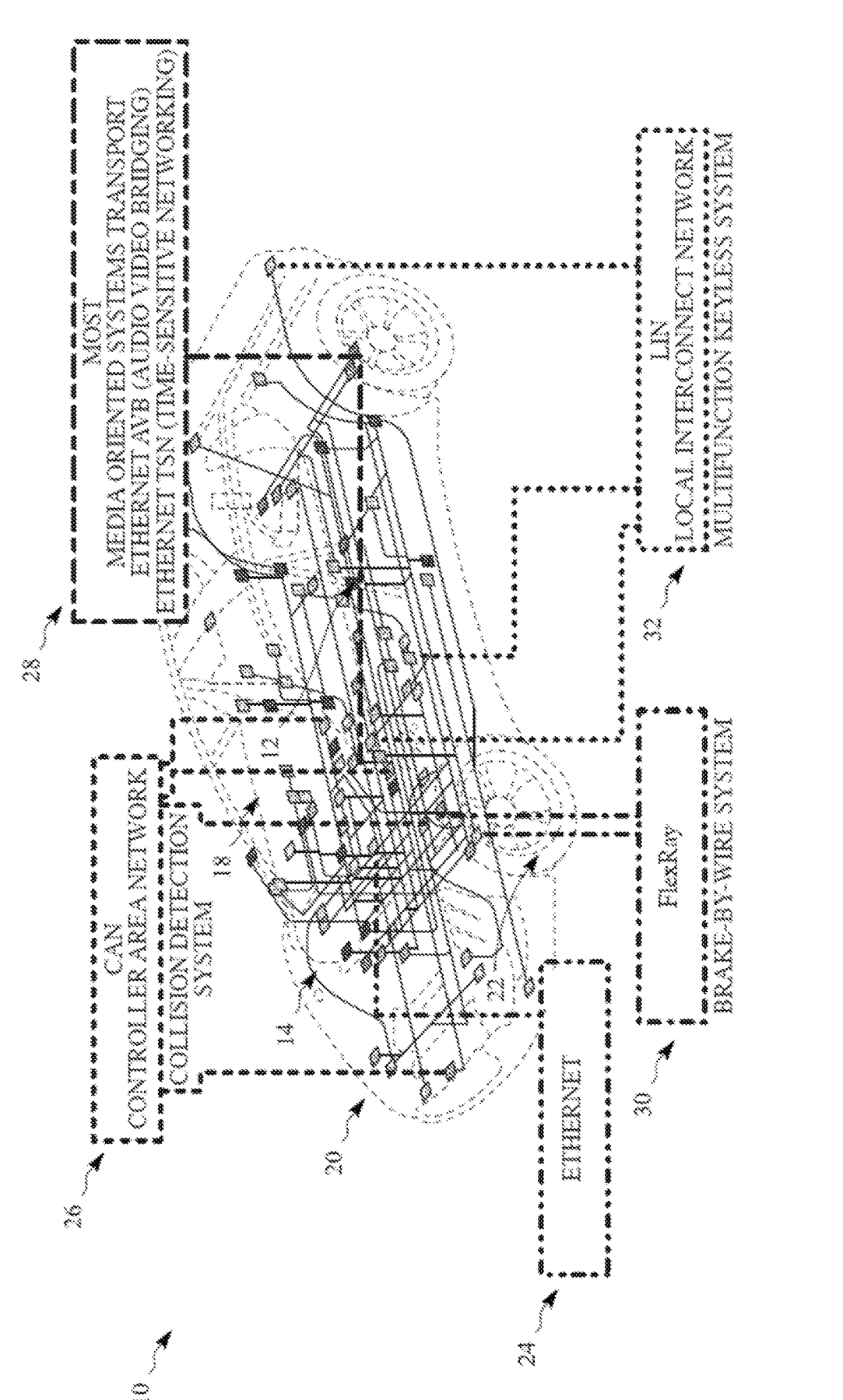
FIG. 1A generally illustrates a vehicle according to the principles of the present disclosure.

The following discussion is directed to various embodiments of the disclosure. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

As described, a vehicle, such as a car, truck, sport utility vehicle, crossover, mini-van, marine craft, aircraft, all-terrain vehicle, recreational vehicle, or other suitable forms of transportation, typically includes a steering system, such as an electronic power steering (EPS) system, a steer-by-wire (SbW) steering system, a hydraulic steering system, or other suitable steering system. The steering system of such a vehicle typically controls various aspects of vehicle steering including providing steering assist to an operator of the vehicle, controlling steerable wheels of the vehicle, and the like. Although described herein with respect to vehicles, the principles of the present disclosure may also be implemented in other types of transportation or non-transportation apparatuses including steering systems.

The vehicle typically includes one or more electric machines, such as electric motors configured to control various aspects of a steering system of the vehicle. A pathway for providing power from the vehicle power source (e.g. battery, alternator, power supply) to a motor controller or one or more motors of the steering system may be provided. This pathway may include of one or many harnesses, wires, connectors, terminals, fuses, or other (e.g., non-traditional) pathways for conducting current, such as a chassis ground, busbar, through an engine block, etc. Anything that can provide a low enough impedance path (high power connection) for the energy transfer can be utilized to provide power to or from the motor controller. A high power electrical harness and connector may supply electrical power from a vehicle electrical system (e.g. battery and/or alternator) to a motor controller for one or more motors of the steering system. Over the life of the vehicle, the high power connection properties may degrade, resulting in eventual loss of ability to provide input power sufficient to deliver the desired electromechanical output power to provide the steering assist or steering angle function. This degradation is observable as an effective increase in the resistance of the power connector or harness. When attempting to deliver this electromechanical output power, the supply current draw through the increased resistance of the high power connection or harness will cause a large voltage drop between the vehicle supply and the motor controller, which may cause the total voltage at the motor controller input to be low enough to result in a "turn off" or "drop from operate state," which may result in loss of function, such as loss of assist in an EPS system, and/or loss of angle control in an advanced driver-assistance system (ADAS) or SbW system. In some examples, even if the motor controller input does not turn off, a reduced available power may result in lower torque assist, lagging response, poor feedback, reduced angle control, and overall reduced steering performance.

In some embodiments, it is desirable to detect this degraded condition and/or to limit an electromechanical output power command based on detecting this degraded condition in order to reduce the required input power and prevent loss of function of the steering system, such as loss of assist in an EPS system, or loss of angle control in an ADAS or SbW system. While performance may be reduced, this may be preferable to alternatives, which could include a full loss of the assist or angle control function.

Some systems may implement techniques to determine degradation of the input power connection (or harness) using available signals within the existing control module and software. An example system for determining power connection degradation is described in more detail in U.S. patent application Ser. No. 17/733,434, filed on Apr. 29, 2022, the entire contents of which are incorporated herein by reference. In this example, electric power is applied to the motor phases and the response is measured. The power applied is V*I, where V and I are vector quantities of applied motor voltage and motor current, respectively. In some examples, the electric power applied is selected to produce zero motor torque. For example, for EPS systems, a sinusoidal, non-torque producing current is applied to the motor phases. For ADAS and SbW systems, a sinusoidal, non-torque producing or a torque producing current may be applied. The measurement of the response (e.g., a drop or change in voltage, such as a bridge voltage of the inverter or at an input of a control module) is indicative of degradation and state of health (SOH) of the input power connection.

In some examples, detectable degradation generally increases over time (e.g., exponentially, linearly, etc.). For example, a measurement of a representative resistance (e.g., a resistance associated with the power connector or harness as described above) may generally increase over time as degradation increases. However, in some examples, features or behavior corresponding to degradation are intermittent. For example, rather than generally increasing over time, one or more measurements indicative of degradation may behave randomly, with intermittent increasing and decreasing measurements (e.g., due to fretting, arcing, etc.). Accordingly, a first resistance measurement may indicate that degradation above some threshold (e.g., a critical resistance) has occurred while a subsequent second resistance measurement indicates that the degradation is less than the threshold.

Accordingly, intermittency detection systems and methods according to the present disclosure are configured to accurately detect degradation intermittencies as described below in more detail.

Further, while described with respect to steering systems, the principles of the present disclosure may be implemented in other types of vehicle or non-vehicle systems comprising a motor and actuator (e.g., a windshield wiper system, propulsion system, window controller, etc.).

FIG. 1A generally illustrates a vehicle 10 according to the principles of the present disclosure. The vehicle 10 may include any suitable vehicle, such as a car, a truck, a sport utility vehicle, a mini-van, a crossover, any other passenger vehicle, any suitable commercial vehicle, or any other suitable vehicle. While the vehicle 10 is illustrated as a passenger vehicle having wheels and for use on roads, the principles of the present disclosure may apply to other vehicles, such as planes, boats, trains, drones, or other suitable vehicles.

The vehicle 10 includes a vehicle body 12 and a hood 14. A passenger compartment 18 is at least partially defined by the vehicle body 12. Another portion of the vehicle body 12 defines an engine compartment 20. The hood 14 may be moveably attached to a portion of the vehicle body 12, such that the hood 14 provides access to the engine compartment 20 when the hood 14 is in a first or open position and the hood 14 covers the engine compartment 20 when the hood 14 is in a second or closed position. In some embodiments, the engine compartment 20 may be disposed on rearward portion of the vehicle 10 than is generally illustrated.

The passenger compartment 18 may be disposed rearward of the engine compartment 20, but may be disposed forward of the engine compartment 20 in embodiments where the engine compartment 20 is disposed on the rearward portion of the vehicle 10. The vehicle 10 may include any suitable propulsion system including an internal combustion engine, one or more electric motors (e.g., an electric vehicle), one or more fuel cells, a hybrid (e.g., a hybrid vehicle) propulsion system comprising a combination of an internal combustion engine, one or more electric motors, and/or any other suitable propulsion system.

In some embodiments, the vehicle 10 may include a petrol or gasoline fuel engine, such as a spark ignition engine. In some embodiments, the vehicle 10 may include a diesel fuel engine, such as a compression ignition engine. The engine compartment 20 houses and/or encloses at least some components of the propulsion system of the vehicle 10. Additionally, or alternatively, propulsion controls, such as an accelerator actuator (e.g., an accelerator pedal), a brake actuator (e.g., a brake pedal), a handwheel, and other such components are disposed in the passenger compartment 18 of the vehicle 10. The propulsion controls may be actuated or controlled by an operator of the vehicle 10 and may be directly connected to corresponding components of the propulsion system, such as a throttle, a brake, a vehicle axle, a vehicle transmission, and the like, respectively. In some embodiments, the propulsion controls may communicate signals to a vehicle computer (e.g., drive by wire) which in turn may control the corresponding propulsion component of the propulsion system. As such, in some embodiments, the vehicle 10 may be an autonomous vehicle.

In some embodiments, the vehicle 10 includes a transmission in communication with a crankshaft via a flywheel or clutch or fluid coupling. In some embodiments, the transmission includes a manual transmission. In some embodiments, the transmission includes an automatic transmission. The vehicle 10 may include one or more pistons, in the case of an internal combustion engine or a hybrid vehicle, which cooperatively operate with the crankshaft to generate force, which is translated through the transmission to one or more axles, which turns wheels 22. When the vehicle 10 includes one or more electric motors, a vehicle battery, and/or fuel cell provides energy to the electric motors to turn the wheels 22.

The vehicle 10 may include automatic vehicle propulsion systems, such as a cruise control, an adaptive cruise control, automatic braking control, other automatic vehicle propulsion systems, or a combination thereof. The vehicle 10 may be an autonomous or semi-autonomous vehicle, or other suitable type of vehicle. The vehicle 10 may include additional or fewer features than those generally illustrated and/or disclosed herein.

In some embodiments, the vehicle 10 may include an Ethernet component 24, a controller area network (CAN) bus 26, a media oriented systems transport component (MOST) 28, a FlexRay component 30 (e.g., brake-by-wire system, and the like), and a local interconnect network component (LIN) 32. The vehicle 10 may use the CAN bus 26, the MOST 28, the FlexRay Component 30, the LIN 32, other suitable networks or communication systems, or a combination thereof to communicate various information from, for example, sensors within or external to the vehicle, to, for example, various processors or controllers within or external to the vehicle. The vehicle 10 may include additional or fewer features than those generally illustrated and/or disclosed herein.

In some embodiments, although not shown, the vehicle 10 may include a steering system, such as an EPS system, a steering-by-wire steering system (e.g., which may include or communicate with one or more controllers that control components of the steering system without the use of mechanical connection between the handwheel and wheels 22 of the vehicle 10), a hydraulic steering system (e.g., which may include a magnetic actuator incorporated into a valve assembly of the hydraulic steering system), or other suitable steering system.

The steering system may include an open-loop feedback control system or mechanism, a closed-loop feedback control system or mechanism, or combination thereof. The steering system may be configured to receive various inputs, including, but not limited to, a handwheel position, an input torque, one or more roadwheel positions, vehicle speed, temperature, other suitable inputs or information, such as any signals available on a vehicle communication bus, or a combination thereof.

Additionally, or alternatively, the inputs may include a handwheel torque, a handwheel angle, a motor velocity, a vehicle speed, an estimated motor torque command, other suitable input, or a combination thereof. The steering system may be configured to provide steering function and/or control to the vehicle 10. For example, the steering system may generate an assist torque based on the various inputs. The steering system may be configured to selectively control a motor of the steering system using the assist torque to provide steering assist to the operator of the vehicle 10. The steering system of the present disclosure is configured to implement intermittency detection systems and methods as described below in more detail.

Figure 1B:
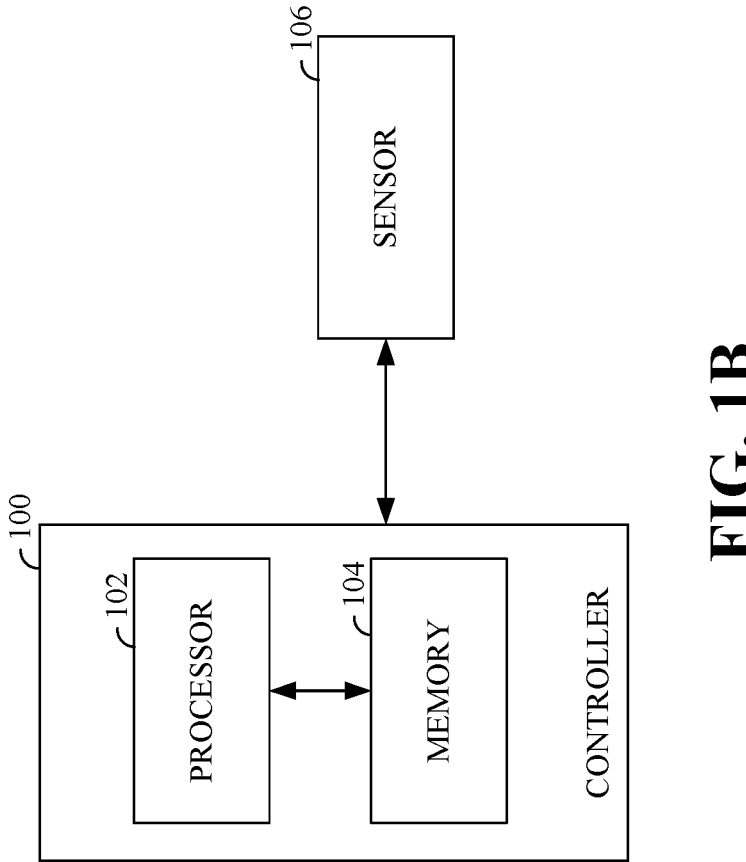
FIG. 1B generally illustrates a controller according to the principles of the present disclosure.

In some embodiments, the vehicle 10 may include a controller, such as controller 100, as is generally illustrated in FIG. 1B. The controller 100 may include any suitable controller, such as an electronic control unit or other suitable controller. The controller 100 may be configured to control, for example, the various functions of the steering system and/or various functions of the vehicle 10. The controller 100 may include a processor 102 and a memory 104. The processor 102 may include any suitable processor, such as those described herein. Additionally, or alternatively, the controller 100 may include any suitable number of processors, in addition to or other than the processor 102. The memory 104 may comprise a single disk or a plurality of disks (e.g., hard drives), and includes a storage management module that manages one or more partitions within the memory 104. In some embodiments, memory 104 may include flash memory, semiconductor (solid state) memory or the like. The memory 104 may include Random Access Memory (RAM), a Read-Only Memory (ROM), or a combination thereof. The memory 104 may include instructions that, when executed by the processor 102, cause the processor 102 to, at least, control various aspects of the vehicle 10. Additionally, or alternatively, the memory 104 may include instructions that, when executed by the processor 102, cause the processor 102 to perform functions associated with the systems and methods described herein.

The controller 100 may receive one or more signals from various measurement devices or sensors 106 indicating sensed or measured characteristics of the vehicle 10. The sensors 106 may include any suitable sensors, measurement devices, and/or other suitable mechanisms. For example, the sensors 106 may include one or more torque sensors or devices, one or more handwheel position sensors or devices, one or more motor position sensor or devices, one or more position sensors or devices, other suitable sensors or devices, or a combination thereof. The one or more signals may indicate a handwheel torque, a handwheel angle, a motor velocity, a vehicle speed, other suitable information, or a combination thereof. As used herein, "sensors" may correspond to physical sensors or derived signals (e.g., signals derived from algorithms or calculations based on one or more sensor inputs both directly into the controller or using data communicated to the controller from sources outside the immediate controller area).

As used herein, "controller" may refer to a hardware module or assembly including one or more processors or microcontrollers, memory, sensors, one or more actuators, a communication interface, etc., any portions of which may be collectively referred to as "circuitry." As described herein, respective functions and steps performed by a given controller, control circuitry, etc. may be collectively performed by multiple controllers, processors, etc. For example, a processor, processing device, controller, control circuitry, etc. "configured to perform" may refer to a single processor, processing device, controller, etc. configured to perform both A and B or may refer to a first processor, processing device, controller, etc. configured to perform A and a second processor, processing device, controller, etc. configured to perform B. For simplicity, "control circuitry configured to perform A and B" may refer to a single or multiple processors, processing devices, controllers, etc. collectively configured to perform A and B. In some examples, one or more functions may be performed remotely (e.g., relative to the vehicle), such as at a controller, processor, circuitry, etc. of a remote server, cloud computing system, and/or other remote processing system.

In some embodiments, the controller 100 may perform the methods described herein. However, the methods described herein as performed by the controller 100 are not meant to be limiting, and any type of software executed on a controller or processor can perform the methods described herein without departing from the scope of this disclosure. For example, a controller, such as a processor executing software within a computing device, can perform the methods described herein.

Figure 2:
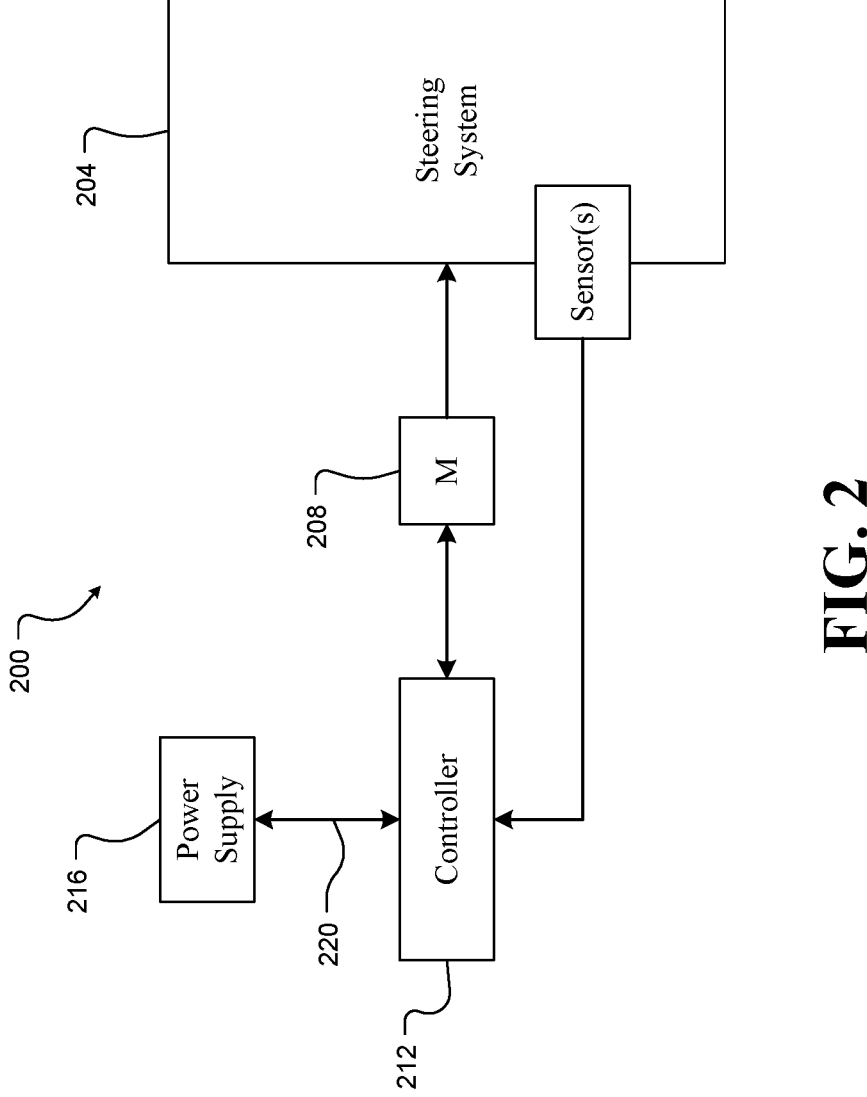
FIG. 2 generally illustrates, schematically, an example electronic power steering (EPS) system according to the principles of the present disclosure.

FIG. 2 generally illustrates, schematically, an example EPS system 200 according to the principles of the present disclosure. Although described with respect to an EPS system, the principles of the present disclosure may be implemented with other types of steering systems, such as SbW and ADAS systems, as well as non-steering systems.

The EPS system 200 includes a steering system 204. Details of the steering system 204 are omitted for simplicity. For example, the steering system 204 may include a rack- and-pinion type steering mechanism responsive to operator input (e.g., a steering wheel, hand wheel, etc.). In some examples, steering assist may be provided via an electric machine, such as a motor 208 (e.g., a permanent magnet synchronous motor).

The motor 208 is responsive to a controller or control circuitry 212, which receives power to control the motor 208 from a power supply 216 (which may include a battery, alternator, etc.) via a wiring harness 220. Although described herein as using the wiring harness 220, the principles of the present disclosure may be implemented for systems includ- ing other types of pathways between the power supply 216 and respective components as described above. Although shown for simplicity as a single connection between the power supply 216 and the controller 212, the wiring harness 220 may include multiple wired connections to various components of the EPS system 200, such as one or more direct connections to the motor 208. The wiring harness 220 may include one or more conductors, such as lengths of wire, bus bars, etc. In some examples, the wiring harness 220 includes one or more connectors, such as spade con- nectors, receptacles, plugs, lugs, wiring terminals, etc. Fur- ther, although described with respect to a single controller 212, the EPS system 200 may include a plurality of con- trollers, each having different connections between the con- troller and the power supply 216, a respective motor, etc., and various state of health indicators may be obtained (e.g., calculated, measured, etc.) in accordance with the principles of the present disclosure for electrical connections of respec- tive controllers, motors, etc.

The controller 212 receives various measurement signals from respective sensors, including, but not limited to, one or more sensors 224 configured to generate measurement sig- nals associated with the steering system 204, along with vehicle state information (vehicle speed, mileage, tempera- ture, etc.) received through a vehicle communication bus. The measurement signals may include a steering angle (e.g., measured by a position sensor) and motor velocity. A motor velocity denoted $\omega\_m$ may be measured, calculated, or a combination thereof. For example, the motor velocity $\omega\_m$ may be calculated as the change of a motor position $\theta$ as measured by a position sensor over a prescribed time interval. For example, motor velocity $\omega\_m$ may be deter- mined as the derivative of the motor position $\theta$ from the equation $\omega\_m=\Delta\theta/\Delta t$, where $\Delta t$ is a sampling time and $\Delta\theta$ is a change in position during the sampling interval. Alterna- tively, motor velocity may be derived from motor position as the time rate of change of position.

The controller 212 controls the motor 208 to supply torque assist to the steering system 204 based on various inputs, measurement signals, etc. For example, the controller 212 is configured to supply corresponding voltages to the motor 208 via an inverter (not shown), which may optionally be incorporated within the controller 212, to cause the motor 208 to generate a desired torque and/or position.

The wiring harness 220 has an associated resistance (e.g., a harness resistance) representing resistance of electrical components in a path of current flow between the power supply 216 and an input to the controller 212 (including paths both to and from the controller 212). For example, the harness resistance has a harness resistance value $R_{harness}$, which is a sum of resistances of the wiring harness 220, vehicle ground, and one or more connectors or connections. Over time, these connections can erode and/or degrade and cause a total path resistance between the power supply 216 and the controller 212 to increase. Accordingly, degradation of the connections can be determined based on the harness resistance.

Figure 3:
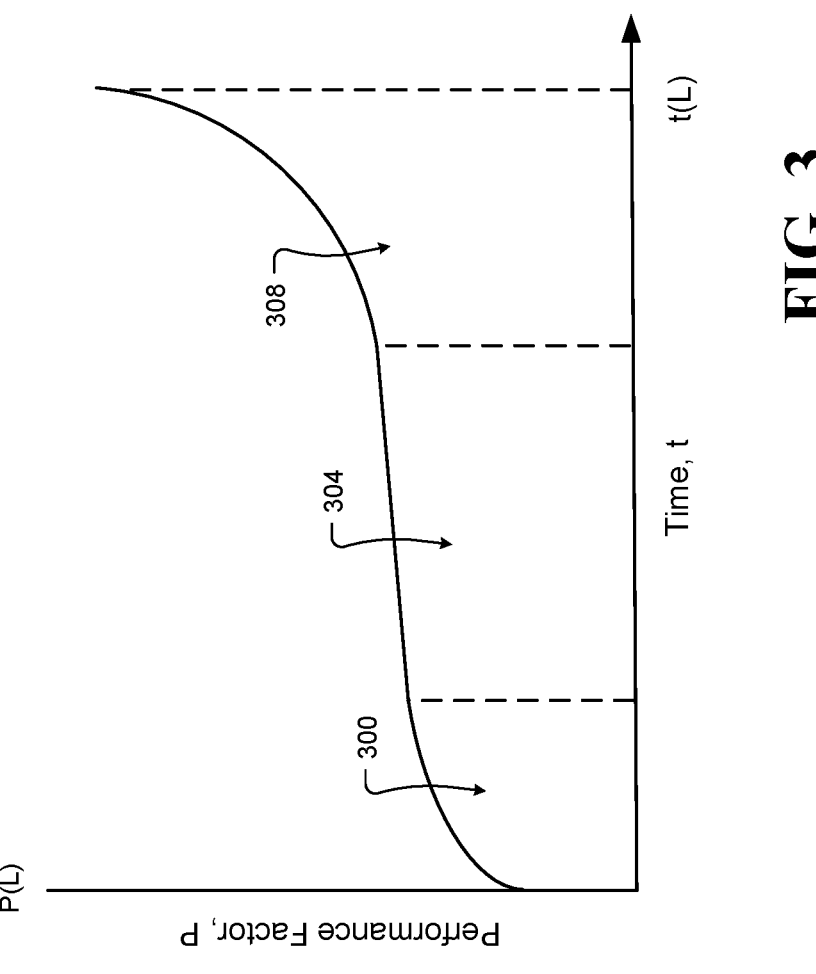
FIG. 3 generally illustrates example degradation of over a lifetime of an electrical connection.

FIG. 3 illustrates example degradation of a performance factor P (e.g., for a limiting performance factor P(L)) over a lifetime t(L) of an electrical connection. Subsequent to a formation period shown at 300, performance is relatively stable (i.e., relatively flat) for a period 304 before experi- encing accelerated aging and degradation of performance in a period 308. Accordingly, while resistance may generally indicate degradation, resistance alone may not accurately indicate state of health, degradation, etc. While shown generally increasing within the period 300, the performance factor P may vary (e.g., increase, decrease, etc.) within the period 300. For example, the period 300 may correspond to a "settling in" period in which various components, mate- rials, connections, etc. stabilize subsequent to installation.

Figure 4:
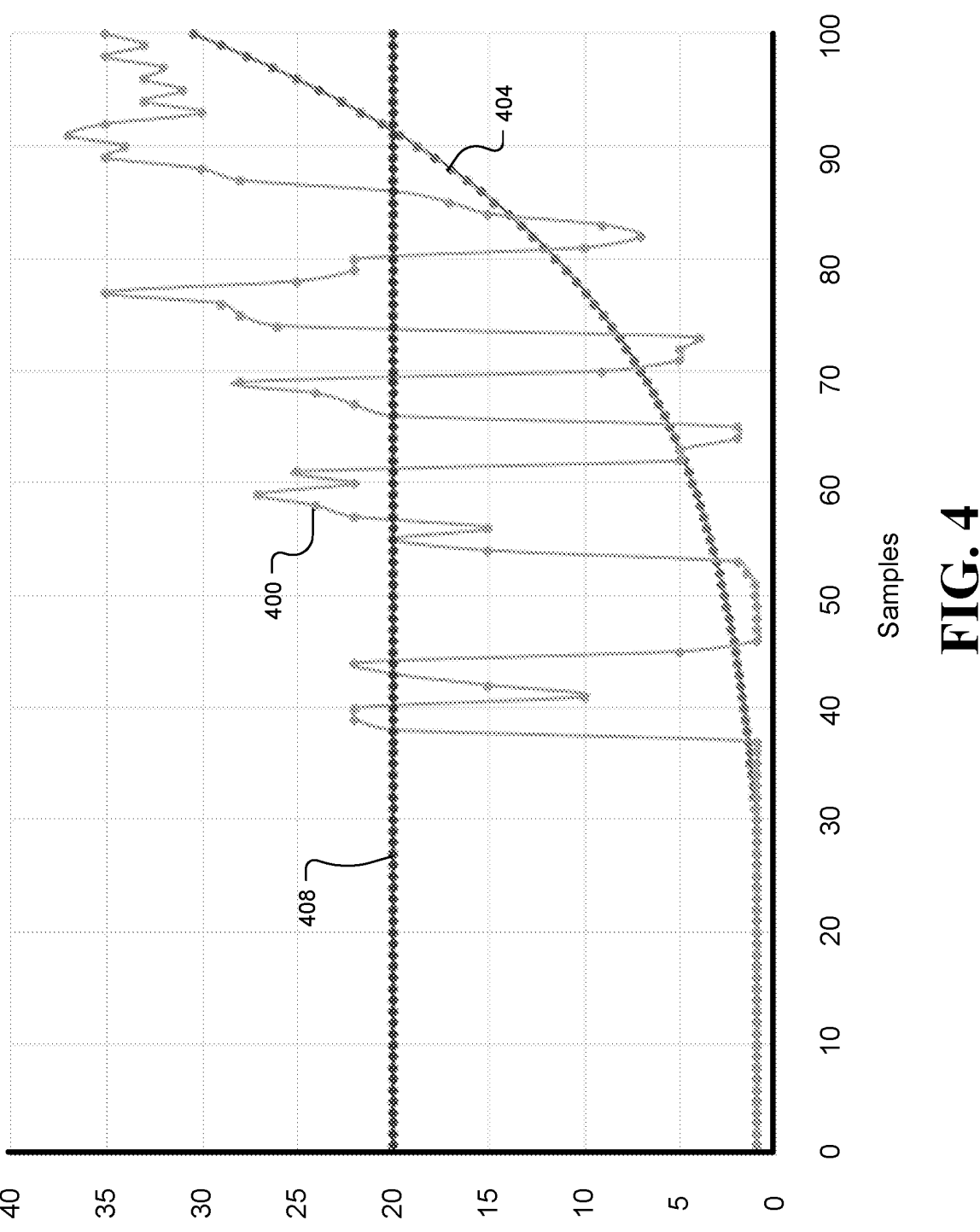
FIG. 4 generally illustrates example sample measurements or calculations indicative of intermittent degradation and non-intermittent degradation.

FIG. 4 illustrates example sample measurements or cal- culations (e.g., measurements or calculations of resistance) indicative of intermittent degradation (at 400) and non- intermittent degradation at (404). The sample measurements 404 indicative of non-intermittent degradation generally increase over time (e.g., exponentially, as shown). Accord- ingly, the sample measurements 404 reach and exceed an example threshold, such as a critical resistance shown at 408. As used herein, the critical resistance 408 is selected to indicate a resistance value at which significant degradation of the electrical connection has occurred (e.g., sufficient degradation to cause performance degradation noticeable to the driver). Further, upon reaching the critical resistance 408, the measured resistance may begin to increase at a greater rate, indicating accelerated aging and degradation.

In different examples, the critical resistance may be set based on different metrics, including, but not limited to: based on when the resistance begins to exponentially increase; based on when the resistance reaches a calibratable predetermined resistance (e.g., 20 milliohms) that is known to cause significant performance degradation; based on when the resistance is a multiple of (e.g., 1.5 times, 2 times, etc.) a lowest ever known resistance value (i.e., historically) at which significant degradation has occurred from a stable baseline condition; and based on when the resistance is within a predetermined or variable range of a critical value at which service would be required. In some examples, the critical resistance may be set lower (and earlier in time) than a value at which the system performance would be affected. For example, the critical resistance may be determined based on an increasing rate of change of the resistance and a fixed time to maintain before exceeding the critical resistance to provide the user sufficient opportunity for servicing prior to reaching the critical resistance. This lower value may be referred to as a warning resistance level or a notification resistance level derived from the rate at which resistance is increasing and an amount of time required for proper service to be scheduled and performed.

Conversely, the sample measurements 400 indicative of intermittent degradation, rather than generally increasing over time, only intermittently exceed the critical resistance 408. For example, one or more conditions such as fretting or arcing may cause highly variable measurement results. Accordingly, the sample measurements 400, at any given time, may not accurately indicate the actual resistance and, accordingly, the amount of degradation.

Figure 5A:
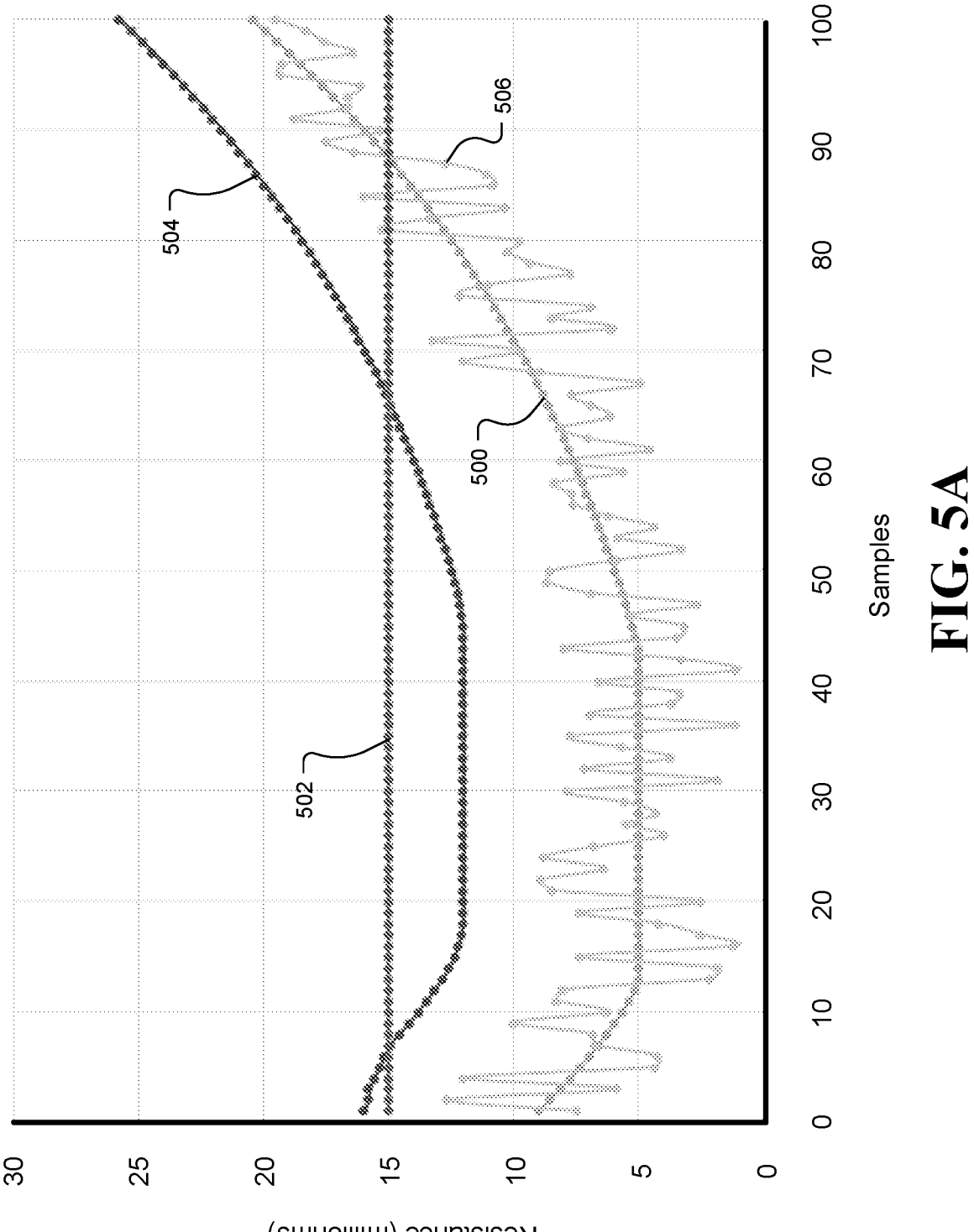
FIGS. 5A-5F generally illustrate example sample measurements relative to various control thresholds according to the principles of the present disclosure.

FIG. 5A illustrates example sample resistance measurements 500 relative to a critical resistance 502. In this example, the measurements generally follow a "bathtub" curve corresponding to an initial decrease in resistance during a first "settling" period, a generally flat, stable second period, and a generally exponential increase in a third period. Intermittency detection systems and methods according to the present disclosure are configured to generate one or more adaptive control thresholds 504 and detect degradation intermittencies based on the control threshold 504.

For example, the control threshold 504 corresponds to an average of n previous measurement samples, plus a calibratable offset (e.g., m) based on the sample measurements 500. For example, the offset corresponds to an expected measurement variation amount. In this example, n=6 and m=7 and the control threshold 504 is calculated for the sample measurements 500. For example, a control threshold C corresponds to an average of n previous samples plus the offset m as follows: C=S/n+m, where S corresponds to a sum of the n previous samples.

Sample measurements corresponding to a more realistic signal (e.g., an example signal having noise) are shown at 506. In this example, the variation in the sample measurements 506 may be caused by vibration, electrical noise, measurement repeatability, quantization error, and/or other random factors rather than fretting, arcing, or other intermittent degradation conditions. Systems and methods according to the present disclosure are configured to compare the sample measurements 506 to a corresponding adaptive control threshold to determine whether the sample measurements 506 indicate the presence of fretting or another degradation intermittency. Adaptive limits based on real world noisy data will tend to be noisier than the control threshold 504, which is based on a clean (i.e., noiseless) input signal (as represented by the measurements 500).

Figure 5B:
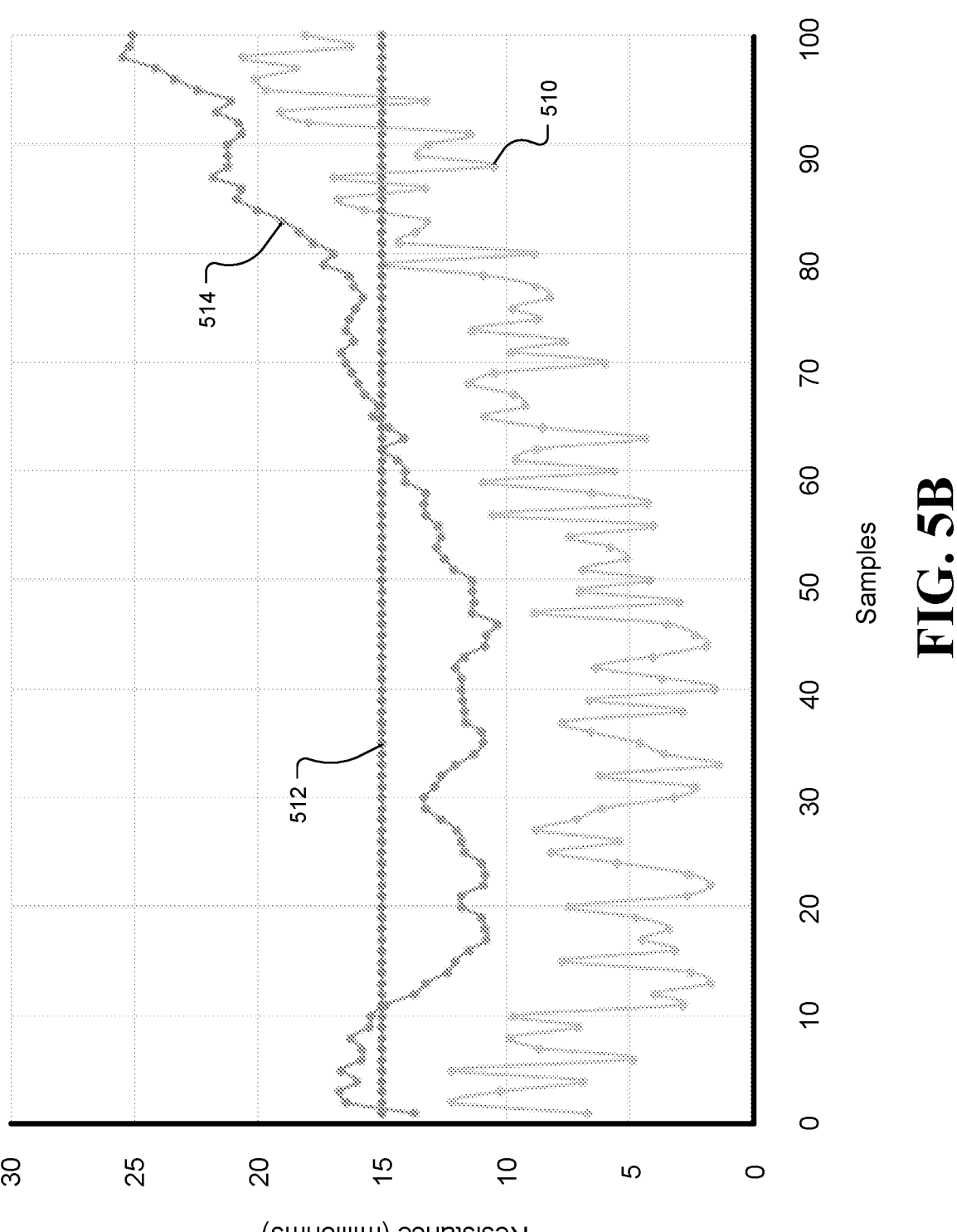

FIG. 5B illustrates example sample resistance measurements 510 of a noisy signal relative to a critical resistance 512 and an adaptive control threshold 514. In this example, the adaptive control threshold 514 is generated based on the measurements 510 (e.g., based on an average of n previous samples of the measurements 510, plus an offset m). In this example, the noisiness of the signal does not produce any samples greater than a corresponding value of the control threshold 514. Accordingly, a degradation intermittency is not detected.

Figure 5C:
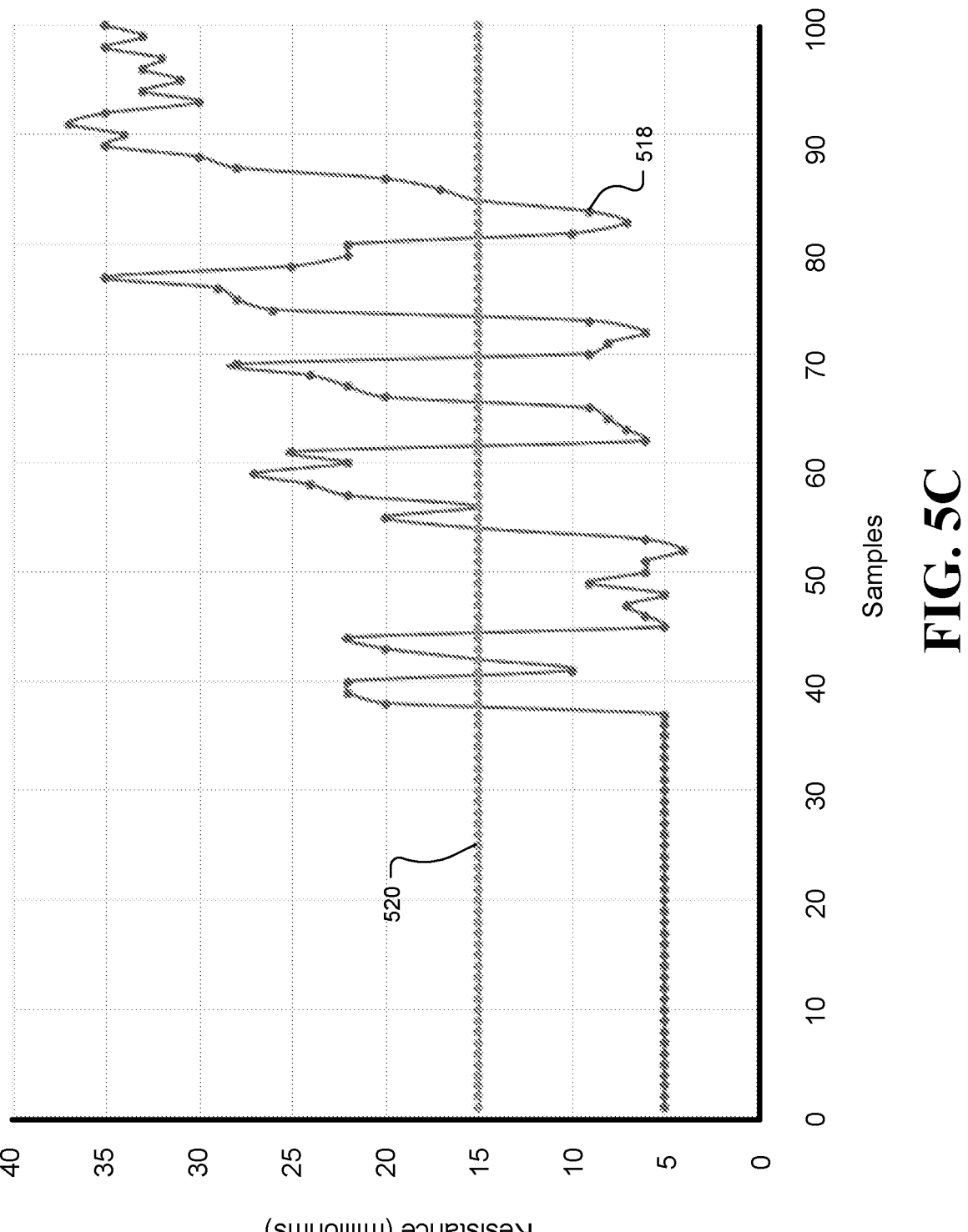
Figure 5D:
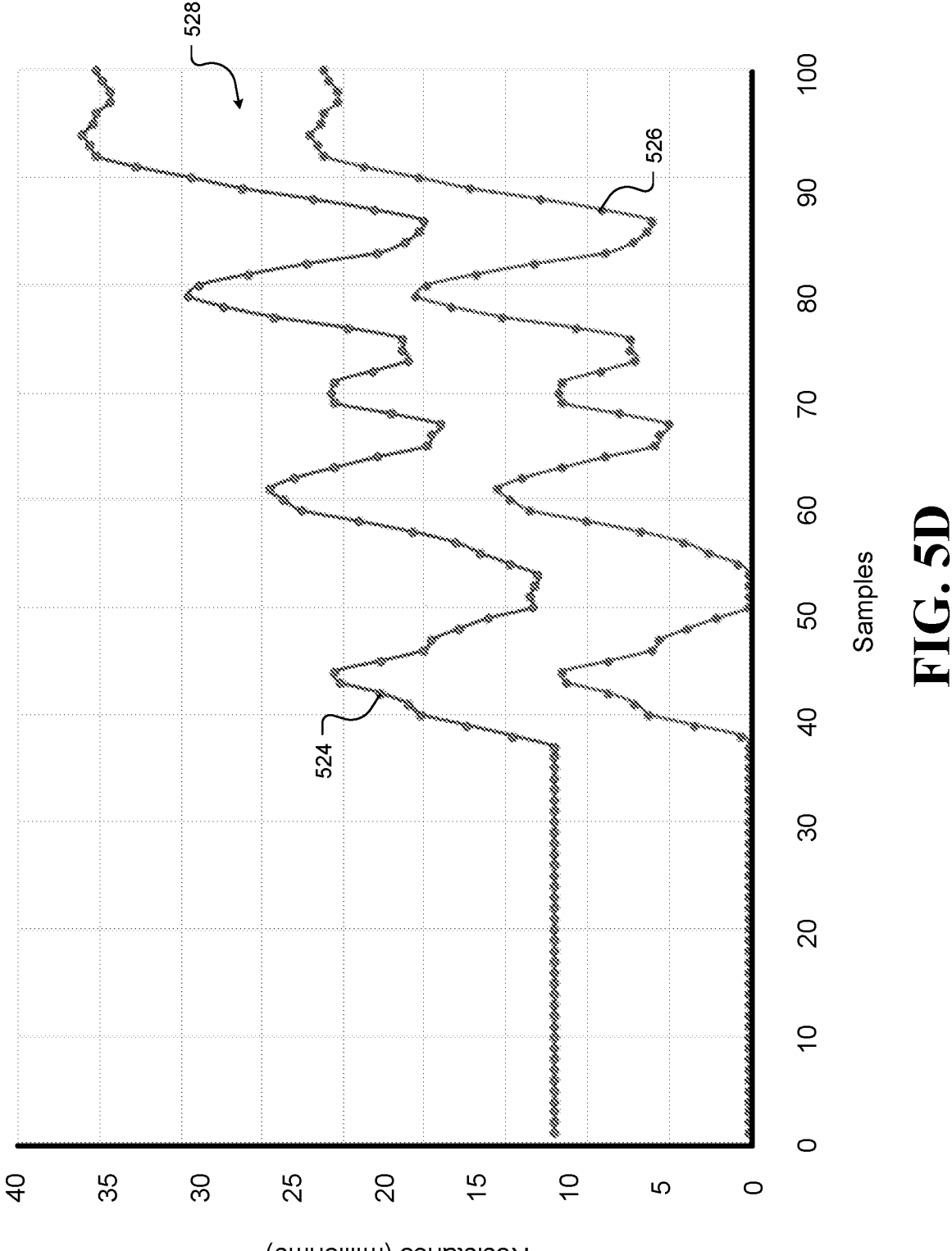

FIG. 5C illustrates example resistance measurements 518 corresponding to a degradation intermittency, such as intermittency caused by fretting, relative to a critical resistance 520. FIG. 5D illustrates example first and second adaptive control thresholds 524 and 526. In this example, the adaptive control thresholds 524 and 526 are generated based on resistance measurements 518. For example, the first (e.g., upper) control threshold 524 is generated based on an average of n previous samples of the measurements 518, plus an offset m. Conversely, the second (e.g., lower) control threshold 526 is generated based on the average of the n previous samples of the measurements 518, minus the offset m. Accordingly, the control thresholds 524 and 526 define a threshold window 528. In other words, the control thresholds 524 and 526 respectively define maximum and minimum boundaries or limits of the threshold window 528.

Figure 5E:
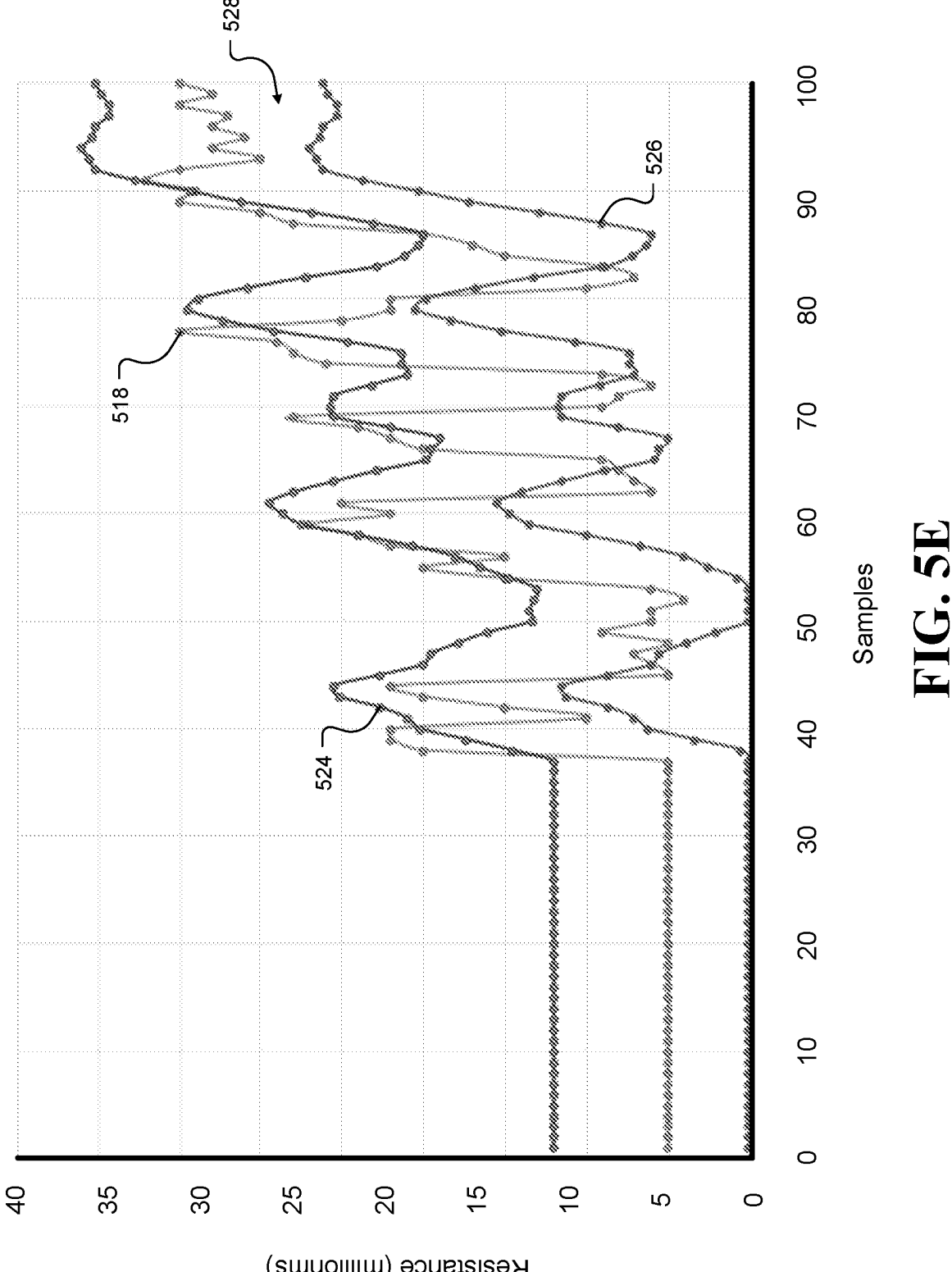

FIG. 5E illustrates the control thresholds 524 and 526 of FIG. 5D overlaid with the example resistance measurements 518 of FIG. 5C. Systems and methods according to the present disclosure are configured to detect (e.g., diagnose) degradation intermittencies, such as fretting, based on a comparison between the resistance measurements 518 and the control thresholds 524 and 526. For example, the resistance measurements 518 are compared to the control thresholds 524 and 526 to determine whether the resistance measurements 518 exceed the control thresholds 524 and 526. As used herein, the term "exceed" refers to the resistance measurements 518 being greater than the control threshold 524 and less than the control threshold 526.

The degradation intermittencies may be detected and identified, and one or more actions may be performed, in response to a determination that one or more of the resistance measurements 518 exceed the control thresholds 524 and 526 (i.e., exceed the threshold window 528). In one example, fretting may be diagnosed based on a frequency or number of times that the resistance measurements 518 exceed the control thresholds 524 and 526 (e.g., over a predetermined diagnosis period or number of samples).

Figure 5F:
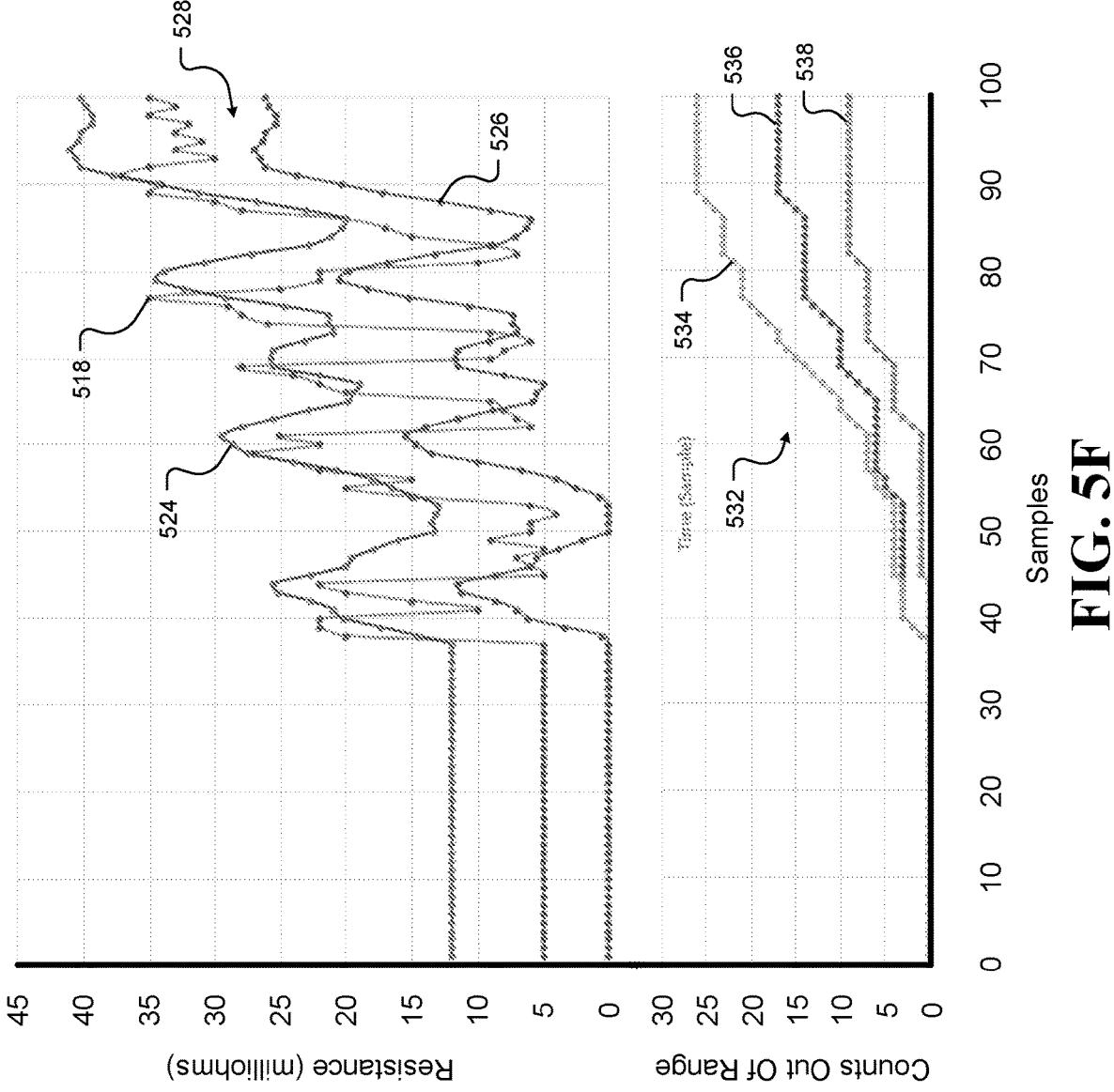

FIG. 5F illustrates example frequency counts 532 corresponding to a number of times the resistance measurements 518 exceeded the control thresholds 524 and 526 (e.g., over a lifetime of a corresponding electrical connection as described above). In other words, the frequency counts 532 correspond to the number of times the resistance measurements 518 were greater than the control threshold 524, less than the control threshold 536, and outside of a range defined by both the first and second control thresholds 524 and 526 (i.e., threshold window 528).

For example, a first count 534 corresponds to a number of times that the resistance measurements 518 were outside of the threshold window 528. A second count 536 corresponds to a number of times that the resistance measurements 518 exceeded the control threshold 524. A third count 538 corresponds to a number of times that the resistance measurements 518 exceeded the control threshold 526. Accordingly, the first count 534 may correspond to a sum of the second count 536 and the third count 538.

In this manner, systems and methods of the present disclosure are configured to detect and selectively diagnose degradation intermittencies (such as fretting) based on the frequency counts 532, which correspond to a number of times the resistance measurements 518 were outside of an expected variation range that is dynamically calculated and adjusted based on historical behavior of the resistance measurements 518. For example, fretting may be diagnosed based on the first count 534, the second count 536, the third count 538, or combinations thereof.

In one example, to diagnose a degradation intermittency, the first count 534 may be compared to a first count threshold, the second count 536 may be compared to a second count threshold, and the third count 538 may be compared to a third count threshold. The first count threshold may be greater than each of the second and third count thresholds but less than a sum of the second and third count thresholds.

The second and third count thresholds may be the same or different. For example, certain intermittencies may be more likely to cause the measurements 518 to exceed the control threshold 526 than the control threshold 524, or vice versa. Accordingly, one of the second and third count thresholds may be greater than or less than the other of the second and third count thresholds to increase sensitivity to and facilitate detection of a specific type of degradation intermittency. In some examples, a type of degradation intermittency may be identified based on which of the first and second thresholds were exceeded. For example, a first type of degradation intermittency may be diagnosed in response to the second count 536 exceeding the second count threshold while a second type of degradation intermittency is diagnosed in response to the third count 538 exceeding the third count threshold.

While determining intermittencies may be based on simply exceeding a count value corresponding to one of the control thresholds, determining intermittencies may be performed using other methods. For example, it may be desirable to detect an intermittency in response to any instances being below a control threshold, or in response to a minimum of two instances above an upper control threshold and one instance below a lower control threshold. As another example, an intermittency may be determined in response to a first count above a first control threshold and a second count below a second threshold occurring within a predetermined number of measurements, which may indicate a relatively quickly changing value indicative of an intermittency (i.e., a rate of change detection outside of an expected rate of change range).

In still other examples, one or more of the counts 532 may be selectively reset, reduced, or otherwise adjusted. For example, the counts 532 may correspond to only a predetermined subset of the measurements 518, such as the most recent p measurements 518 (where p is a calibratable value that may differ for each of the counts 532), only the measurements 518 from a predetermined period (e.g., the previously month, the previous two-month period, etc.), and so on. In another example, one or more of the counts 532 may be reset (e.g., set to 0) or reduced in response to a determination that the measurements 518 have not exceeded either of the control thresholds 524 and 526 for a predetermined reset period or number of samples (e.g., the measurements 518 have not exceeded either of the control thresholds 524 and 526 for the last three months, over the last twenty samples, etc.). One or more of the counts 532 may also be reset after service or replacement of various parts.

FIG. 6 is a flow diagram generally illustrating steps of an example method 600 for detecting degradation intermittencies according to the principles of the present disclosure. The method 600 may be performed by one or more components of the systems described herein, such as one or more controllers (e.g., the controller 100), one or more processors or processing devices (e.g., the processor 102), and/or other circuitry. In an example, one or more processors are configured to execute instructions stored in memory to perform the method 600.

At 604, one or more measurements indicative of a SOH of an electrical connection are generated and received. Measurements may include, but are not limited to, one or more resistances associated with the electrical connection as described herein. In one example, electric power is applied as a sinusoidal current to a motor associated with an EPS system, a response corresponding to the applied power is measured, and a resistance of the electrical connection is calculated based on the current and the response.

At 608, one or more adaptive control thresholds are calculated based on the measurements. In an example, upper and lower control thresholds are calculated based on average of a subset of the measurements and an offset respectively added to and subtracted from the average as described herein. The upper and lower control thresholds define an adaptive threshold window.

At 612, a measurement (e.g., a current or most recent measurement) is compared to the upper and lower control thresholds. At 616, one or more frequency counts are updated in response to the comparison between the measurement and the upper and lower control thresholds. At 620, the one or more frequency counts are compared to respective count thresholds.

At 624, one or more actions are performed in response to one or more of the frequency counts exceeding a respective count threshold. In one example, one or more flags or other indicators are stored, generated, etc. For example, a notification or other indicator may be provided to a driver or user, manufacturer, dealership, service facility, etc. As one example, the notification is provided to the driver or user via an in-vehicle display or interface (e.g., a display of an infotainment system or other dashboard indicator), a mobile device, etc. For example, the notification (e.g., a check engine light or other indictors) may indicate that the vehicle is in need of servicing, recommend that the driver or user schedule servicing to inspect and replace or repair components of the electrical connection, the electrical power system, etc.

In another example, the notification may indicate that one or more predicted values for the SOH of the electrical connection (e.g. an accumulated health calculation, a remaining usable life calculation, etc.) are inaccurate due to a degradation intermittency. In examples where various SOH values or indicators are provided to a driver or other entity, such a value or indicator may be withheld (e.g., not provided to the driver) in response to the one or more of the frequency counts exceeding the respective count threshold. In some examples, since accurate determination of SOH (and prediction of future SOH) may be difficult when various intermittencies are present, the SOH may be set to 0 or another relatively low value to indicate that current and/or future SOH are in an unpredictable state and system health cannot be reliably predicted. Corresponding data may be sent to a remote server or cloud computing system for remote analysis, to local diagnostic tools attached to the vehicle (e.g., OBDII readers or other diagnostic devices), etc.

In another example, control of one or more vehicle operating parameters (e.g., current provided to the motor, to the controller, etc.) may be adjusted in various conditions (e.g., when a measured temperature of the vehicle or a vehicle system is above a threshold). For example, in response to detecting a degradation intermittency, various parameters may be controlled (e.g., current provided to the motor) to minimize additional wear on the electrical system and avoid failure.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

The word "example" is used herein to mean serving as an example, instance, or illustration. Any aspect or design described herein as "example" is not necessarily to be construed as preferred or advantageous over other aspects or designs. Rather, use of the word "example" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an implementation" or "one implementation" throughout is not intended to mean the same embodiment or implementation unless described as such.

Implementations the systems, algorithms, methods, instructions, etc., described herein can be realized in hardware, software, or any combination thereof. The hardware can include, for example, computers, intellectual property (IP) cores, application-specific integrated circuits (ASICs), programmable logic arrays, optical processors, programmable logic controllers, microcode, microcontrollers, servers, microprocessors, digital signal processors, or any other suitable circuit. In the claims, the term "processor" should be understood as encompassing any of the foregoing hardware, either singly or in combination. The terms "signal" and "data" are used interchangeably.

As used herein, the term module can include a packaged functional hardware unit designed for use with other components, a set of instructions executable by a controller (e.g., a processor executing software or firmware), processing circuitry configured to perform a particular function, and a self-contained hardware or software component that interfaces with a larger system. For example, a module can include an application specific integrated circuit (ASIC), a Field Programmable Gate Array (FPGA), a circuit, digital logic circuit, an analog circuit, a combination of discrete circuits, gates, and other types of hardware or combination thereof. In other embodiments, a module can include memory that stores instructions executable by a controller to implement a feature of the module.

Further, in one aspect, for example, systems described herein can be implemented using a general-purpose computer or general-purpose processor with a computer program that, when executed, carries out any of the respective methods, algorithms, and/or instructions described herein. In addition, or alternatively, for example, a special purpose computer/processor can be utilized which can contain other hardware for carrying out any of the methods, algorithms, or instructions described herein.

Further, all or a portion of implementations of the present disclosure can take the form of a computer program product accessible from, for example, a computer-usable or computer-readable medium. A computer-usable or computer-readable medium can be any device that can, for example, tangibly contain, store, communicate, or transport the program for use by or in connection with any processor. The medium can be, for example, an electronic, magnetic, optical, electromagnetic, or a semiconductor device. Other suitable mediums are also available.

The above-described embodiments, implementations, and aspects have been described in order to allow easy understanding of the present invention and do not limit the present invention. On the contrary, the invention is intended to cover various modifications and equivalent arrangements included within the scope of the appended claims, which scope is to be accorded the broadest interpretation so as to encompass all such modifications and equivalent structure as is permitted under the law.

What is claimed is:

1. A method for detecting degradation intermittencies in an electrical connection in a steering system of a vehicle, the method comprising, using a processor configured to execute instructions:

14 receiving an input indicative of a resistance associated with the electrical connection, wherein the input is indicative of a plurality of measurements of the resistance;

calculating, based on the received input, at least one adaptive control threshold;

comparing a first measurement of the plurality of measurements to the at least one adaptive control threshold;

determining whether the electrical connection has a degradation intermittency in response to the comparison between the first measurement and the at least one adaptive control threshold; and performing at least one action associated with operation of the vehicle in response to determining that the electrical connection has the degradation intermittency, wherein performing the at least one action includes at least one of:

generating and displaying an indicator associated with the operation of the vehicle in response to determining that the electrical connection has the degradation intermittency; and controlling at least one operating parameter of the vehicle in response to determining that the electrical connection has the degradation intermittency.

2. The method of claim 1, wherein calculating the at least one adaptive control threshold includes calculating a first adaptive control threshold and a second adaptive control threshold that define a threshold window.

3. The method of claim 2, wherein comparing the first measurement includes comparing the first measurement to the first adaptive control threshold and the second adaptive control threshold.

4. The method of claim 3, further comprising determining that the electrical connection has the degradation intermittency in response to the first measurement being greater than the first adaptive control threshold or lower than the second adaptive control threshold.

5. The method of claim 4, further comprising counting a number of times that one of the plurality of measurements is either greater than the first adaptive control threshold or lower than the second adaptive control threshold and determining that the electrical connection has the degradation intermittency based on the counted number of times.

6. The method of claim 5, further comprising determining that the electrical connection has the degradation intermittency in response to a comparison between the counted number of times and at least one count threshold.

7. The method of claim 1, further comprising calculating the at least one adaptive control threshold based on (i) an average of a predetermined number of the plurality of measurements and (ii) an offset.

8. The method of claim 1, further comprising obtaining the resistance by supplying a sinusoidal current to a motor of the steering system, measuring a response of the motor, and calculating the resistance based on the sinusoidal current and the measured response.

9. The method of claim 8, wherein the sinusoidal current is a non-torque producing current.

10. The method of claim 1, wherein the steering system is an electronic power steering (EPS) system and the electrical connection is an electrical connection between a power supply and a motor of the EPS system.

11. A system for detecting degradation intermittencies in an electrical connection in a steering system of a vehicle, the system comprising;

at least one sensor configured to generate an output indicative of a resistance associated with the electrical connection, wherein the output is indicative of a plurality of measurements of the resistance; and a controller configured to calculate, based on the output, at least one adaptive control threshold, compare a first measurement of the plurality of measurements to the at least one adaptive control threshold, determine whether the electrical connection has a degradation intermittency in response to the comparison between the first measurement and the at least one adaptive control threshold, and perform at least one action associated with operation of the vehicle in response to determining that the electrical connection has the degradation intermittency, wherein performing the at least one action includes at least one of:

generating and displaying an indicator associated with the operation of the vehicle in response to determining that the electrical connection has the degradation intermittency; and controlling at least one operating parameter of the vehicle in response to determining that the electrical connection has the degradation intermittency.

12. The system of claim 11, wherein calculating the at least one adaptive control threshold includes calculating a first adaptive control threshold and a second adaptive control threshold that define a threshold window.

13. The system of claim 12, wherein comparing the first measurement includes comparing the first measurement to the first adaptive control threshold and the second adaptive control threshold.

14. The system of claim 13, wherein the controller is further configured to determine that the electrical connection has the degradation intermittency in response to the first measurement being greater than the first adaptive control threshold or lower than the second adaptive control threshold.

15. The system of claim 14, wherein the controller is further configured to count a number of times that one of the plurality of measurements is either greater than the first adaptive control threshold or lower than the second adaptive control threshold and determine that the electrical connection has the degradation intermittency based on the counted number of times.

16. The system of claim 15, wherein the controller is further configured to determine that the electrical connection has the degradation intermittency in response to a comparison between the counted number of times and at least one count threshold.

17. The system of claim 11, wherein the controller is further configured to calculate the at least one adaptive control threshold based on (i) an average of a predetermined number of the plurality of measurements and (ii) an offset.

18. The system of claim 11, wherein the controller is further configured to obtain the resistance by supplying a sinusoidal current to a motor of the steering system, measuring a response of the motor, and calculating the resistance based on the sinusoidal current and the measured response.

19. The system of claim 11, wherein the steering system is an electronic power steering (EPS) system and the electrical connection is an electrical connection between a power supply and a motor of the EPS system.

\* \* \* \* \*